United States Patent
Lee et al.

(10) Patent No.: US 6,376,027 B1
(45) Date of Patent: Apr. 23, 2002

(54) METHOD FOR CRYSTALLIZING LITHIUM TRANSITION METAL OXIDE THIN FILM BY PLASMA TREATMENT

(75) Inventors: Jai Young Lee; Youn Seon Kang; Ho Lee; Sung Chul Park; Yong Mook Kang, all of Daejeon Kwangyeok-si (KR)

(73) Assignee: Korea Advanced Institute of Science and Technology, Kwangyeok-Si (KR)

(*) Notice: Subject to any disclaimer, the term of this patent is extended or adjusted under 35 U.S.C. 154(b) by 0 days.

(21) Appl. No.: 09/688,987

(22) Filed: Oct. 17, 2000

(30) Foreign Application Priority Data

May 1, 2000 (KR) .......................................... 2000-23286

(51) Int. Cl.$^7$ ................................................ H05H 1/00
(52) U.S. Cl. .................... 427/535; 427/539; 427/255.31
(58) Field of Search ................................ 427/535, 539, 427/255.31, 126.3; 429/218, 209

(56) References Cited

U.S. PATENT DOCUMENTS

| | | | |
|---|---|---|---|
| 5,538,814 A | * 7/1996 | Kamauchi et al. | 429/336 |
| 5,641,591 A | * 6/1997 | Kawakami et al. | 429/223 |
| 5,853,914 A | * 12/1998 | Kawakami | 429/66 |
| 5,888,666 A | * 3/1999 | Kawakami | 429/62 |
| 6,168,884 B1 | * 1/2001 | Neudecker et al. | 429/162 |

OTHER PUBLICATIONS

Schuegraf, Klaus K., Handbook of Thin–Film Deposition Processes and Techniques. Noyes Publications, Park Ridge, NJ, pp. 394–395, 1988.*

* cited by examiner

Primary Examiner—Bret Chen
(74) Attorney, Agent, or Firm—Rosenberg, Klein & Lee

(57) ABSTRACT

A method for crystallizing a lithium transition metal oxide thin film for an electrode of a thin film-type lithium secondary battery is provided, in which the lithium transition metal oxide thin film is reacted with oxygen or argon plasma induced by a microwave or a radio frequency wave, thereby obtaining an excellent lithium transition metal oxide thin film in a degree of crystallization and electrochemical characteristics.

7 Claims, 5 Drawing Sheets

US 6,376,027 B1

METHOD FOR CRYSTALLIZING LITHIUM TRANSITION METAL OXIDE THIN FILM BY PLASMA TREATMENT

BACKGROUND OF THE INVENTION

1. Field of the Invention

The present invention relates to an improvement in a degree of crystalline of a lithium transition metal oxide thin film for an electrode of a thin film-type lithium battery (hereinafter referred as a lithium thin film battery), and more particularly to a method for crystallizing a lithium transition metal oxide thin film, in which the lithium transition metal oxide thin film is reacted with oxygen or argon plasma induced by a microwave (frequency: 2.45 GHz) or a radio frequency (hereinafter referred as an RF) wave (frequency: 13.56 MHz), thereby obtaining an excellent lithium transition metal oxide thin film in a degree of crystalline and electrochemical characteristics.

2. Description of the Related Art

According as rapid growth of portable electric equipments, such as; a notebook, a camcorder, a mobile telephone and a compact sound recorder has brought a increasing demand for these portable electric equipments, a development of batteries as an energy source for the equipments becomes an important problem to be solved, and there is a great rush for rechargeable secondary batteries among others. Particularly, a lithium secondary battery is being more investigated and commercialized than any other secondary battery.

Of these lithium secondary batteries, a lithium thin film battery is used in a field of microelectronics requiring charge/discharge capacity of 200 $\mu$Ah and lower electric power of 1 to 10 $nA/cm^2$ and more specially in a field of MEMS (Micro Electro-Mechanical System), semiconductor memory, thin film-type gas sensor, smart card, micro medical equipment capable of being installed within the human body and so forth, and has an advantage that a shape and a size of the battery are adapted at one's convenience to the application fields to be used.

A process for realizing the lithium thin film battery comprises the steps of: (1) preparing one type of substrate among a silicon substrate, an alumina substrate, a glass substrate and a metal substrate such as an aluminum substrate; (2) vapor-depositing current collectors for an anode and a cathode; (3) vapor-depositing an anode thin film; (4) vapor-depositing a solid electrolyte thin film; (5) vapor-depositing a cathode thin film; (6) vapor-depositing a protector film; and the like. Of these steps, vapor depositions of the anode, cathode and solid electrolyte thin films are the most important steps to determine an overall process temperature as well as duration and capacity of the battery. Lithium transition metal oxides, such as, $LiCoO_2$, $LiNiO_2$, $LiMn_2O_4$, $V_2O_5$, $V_6O_{13}$, $SnO_2$, $TiS_2$, $LiAl$, $LiGaO_2$, $LiTiO_2$, $Li_3PO_4$, etc. or mixtures thereof are used as material of these thin films. In order that these oxides may charge and discharge lithium ions in an electrochemically stable manner, $LiCoO_2$ and $LiNiO_2$ must be of a lamella structure, and $LiMn_2O_4$ must be of a spinel structure to have an excellent degree of crystalline. Of course, the other oxides show better duration and capacity of charge/discharge in a crystalline state than in an amorphous state.

At present, lithium transition metal oxides are thermally treated at a temperature between 750° C. and 850° C. for a time between several hours and several tens of hours in a furnace under an oxygen atmosphere and so crystallized before they are used in commercialized lithium secondary batteries. This furnace-thermal treatment performed at such a high temperature for such a long time gives rise to many problems in that (1) atoms are diffused to and mixed with each other between the anode, cathode and electrolyte thin films; (2) since metal substrates having a lower melting point cannot be used, there is no choice but to use materials having a higher melting point, such as, a ceramic substrate; and (3) the treatment cannot be used together with the existing semiconductor processes. As the result of that, it is impossible to apply the furnace-thermal treatment to the lithium thin film battery.

Therefore, many researchers have attempted to crystallize the lithium transition metal oxide thin film using a new technology. For example, P. Fragnaud et al., J. Power Source, 54 (1995), pp. 362–366 used a chemical gaseous vapor deposition, K. A. Striebel et al., J. Electrochem. Soc., 143 (1996), pp. 1821–1827 used a pulsed laser vapor deposition, and M. Yoshimura et al., Solid State Ionics 106 (1998), pp. 39–44 used a electrochemical-hydrothermal synthesis so as to seek to obtain a lithium transition metal oxide thin film having an excellent degree of crystalline directly at a stage of vapor deposition without a thermal treatment. In addition to these researches for improving the degree of crystalline directly at the stage of vapor deposition, there have been performed some researches for improving the degree of crystalline by a thermal treatment after a vapor deposition. For instance, Hong-Koo Baik et al., J. Electrochem. Soc., 143 (1996), pp. L268–L270 vapor-deposited a lithium transition metal oxide thin film by an electron beam evaporation and then applied a thermal treatment to the thin film in a furnace, and S. K. Joo et al., J. Electrochem. Soc., 141 (1994), pp. 3296–3299 vapor-deposited a lithium transition metal oxide thin film by sputtering and then performed rapid thermal annealing of the thin film, both researches being intended to improve the degree of crystalline of the lithium transition metal oxide thin film.

However, the attempts to improve the degree of crystalline directly at the stage of vapor deposition were not satisfactory, and although the attempts using the thermal treatment following the vapor deposition succeeded in the improvement of the degree of crystalline, they still have a shortcoming in lowering the process temperature to 500° C. or less. Thus, there is a desire to develop a new treatment technology other than the existing technology.

SUMMARY OF THE INVENTION

Accordingly, the present invention has been made to overcome the above-mentioned problems, and it is an object of the present invention to provide a novel method for crystallizing a lithium transition metal oxide thin film, in which the lithium transition metal oxide thin film is treated at a lower temperature of 500° C. or less for a shorter time without use of the conventional furnace-thermal treatment, thereby obtaining a lithium transition metal oxide thin film having an enhanced degree of crystalline and excellent electrochemical characteristics.

To achieve this object, there is provided a method for crystallizing a lithium transition metal oxide thin film in accordance with an aspect of the present invention, the method comprising the steps of:

vapor-depositing a lithium transition metal oxide thin film as electrode material on a substrate; and treating the lithium transition metal oxide thin film by plasma.

Preferably, the lithium transition metal oxide thin film for an anode electrode of a lithium thin film battery is one type of oxide thin film selected from the group consisting of $LiCoO_2$, $LiNiO_2$, $LiMn_2O_4$, $V_2O_5$, $V_6O_{13}$, $SnO_2$, $TiS_2$, LiAl, $LiGaO_2$, $LiTiO_2$, $Li_3PO_4$ and mixtures thereof, and the plasma to be reacted with this oxide thin film is oxygen or inert gas plasma induced by a microwave (frequency: 2.45 GHz) or an RF wave (frequency: 13.56 MHz).

In another aspect of the present invention, a sputtering device used in the vapor deposition of the lithium transition metal oxide thin film according to the present invention is a reactive RF magnetron sputtering system device including a vacuum system, a sputtering target, an RF power source, a substrate holder and a gas injector.

It is preferred that the substrate is a $Pt/Ti/SiO_2/Si$ substrate in which p-type (100) silicon (Si) as a base is covered with silicon oxide ($SiO_2$), titanium (Ti) and platinum (Pt) in sequence. The platinum acts as a collector, and the titanium serves to facilitate covering of the platinum on the $SiO_2$ and to prevent diffusion of the platinum at a high temperature. Preferably, purity of the target used in the vapor deposition is 99.99% or more, argon and oxygen gases having a purity of 99.9999%, respectively are used as the reaction gas, and an initial degree of vacuum is $5 \times 10^{-7}$ Torr or less.

The vapor deposition of the lithium transition metal oxide thin film is preferably performed under the conditions that RF power is 100 W, a pressure of the vapor deposition is 3 mTorr, a temperature of the substrate is 350° C., and respective flow rates of the argon and oxygen gases are 8 sccm. However, the present invention is not limited to these illustrative conditions of the vapor deposition, but the plasma treatment process according to the present invention is suitable to any lithium transition metal oxide thin films vapor-deposited under other conditions.

The essence of the present invention is in that the oxygen or argon plasma treatment of the lithium transition metal oxide thin film is performed as a post-treatment process following the vapor deposition of the thin film using the microwave or RF plasma treatment device, thereby enhancing the degree of crystalline, surface flatness and electrochemical stability of the lithium transition metal oxide thin film.

In still another aspect of the present invention, the microwave plasma treatment device is of a bell-jar-type using a microwave of 2.45 GHz, in which a graphite block having a size similar to that of the silicon substrate is installed on a substrate holder and a nonconductor quartz dome is used as a reaction tube. Within the reaction tube is provided a counter electrode comprising a stainless tube having a predetermined diameter and a kanthal wire wound around the stainless tube. Also, conditions of the oxygen plasma treatment are preferably such that microwave power is 500 W, a flow rate of the oxygen is 50 sccm, a pressure is 10 Torr or less, and a treatment time is 0 to 20 min, but the present invention is not limited to these conditions so that those skilled in the art can use any properly chosen conditions. On the other hand, the sputtering device is used as the RF plasma treatment device just as in the vapor deposition, but preferable conditions of the RF plasma treatment are such that an RF is 13.56 MHz, power is 20 W, a pressure is 3 mTorr, respective flow rates of the oxygen and argon gases are 8 sccm, and a treatment time is 0 to 20 min. Similarly, the present invention is not limited to these conditions and it is possible for those skilled in the art to use any properly chosen conditions.

Besides the oxygen and argon gases, inert gases, such as, helium, neon, krypton or xenon and mixture gas of oxygen and inert gas are available for the plasma treatment according to the present invention.

These gases are expected to give an ion etching effect and other advantageous effects due to chemical reactions. That is, such gases exist as ion/radical phases with high energy within the plasma, collide against the lithium transition metal oxide thin film to transmit thermal energy to the thin film, fill in cavities of the oxygen, and participate in a chemical bonding with inner metal atoms, thereby enhancing the degree of crystalline and flatness of the lithium transition metal oxide thin film.

BRIEF DESCRIPTION OF THE DRAWINGS

The above objects, and other features and advantages of the present invention will become more apparent from the following detailed description in conjunction with the drawings, in which.

DETAILED DESCRIPTION OF PREFERRED EMBODIMENTS

Hereinafter, preferred embodiments of the present invention will be described with reference to the accompanying drawings. In the following description and all drawings, similar parts having the same function will be designated by similar numerals, and so repetition of the description on the same parts will be omitted. Also, since these embodiments are given only for the purpose of description, it will be apparent by those skilled in the art that the present invention is not limited to these embodiments.

Figure 1A:
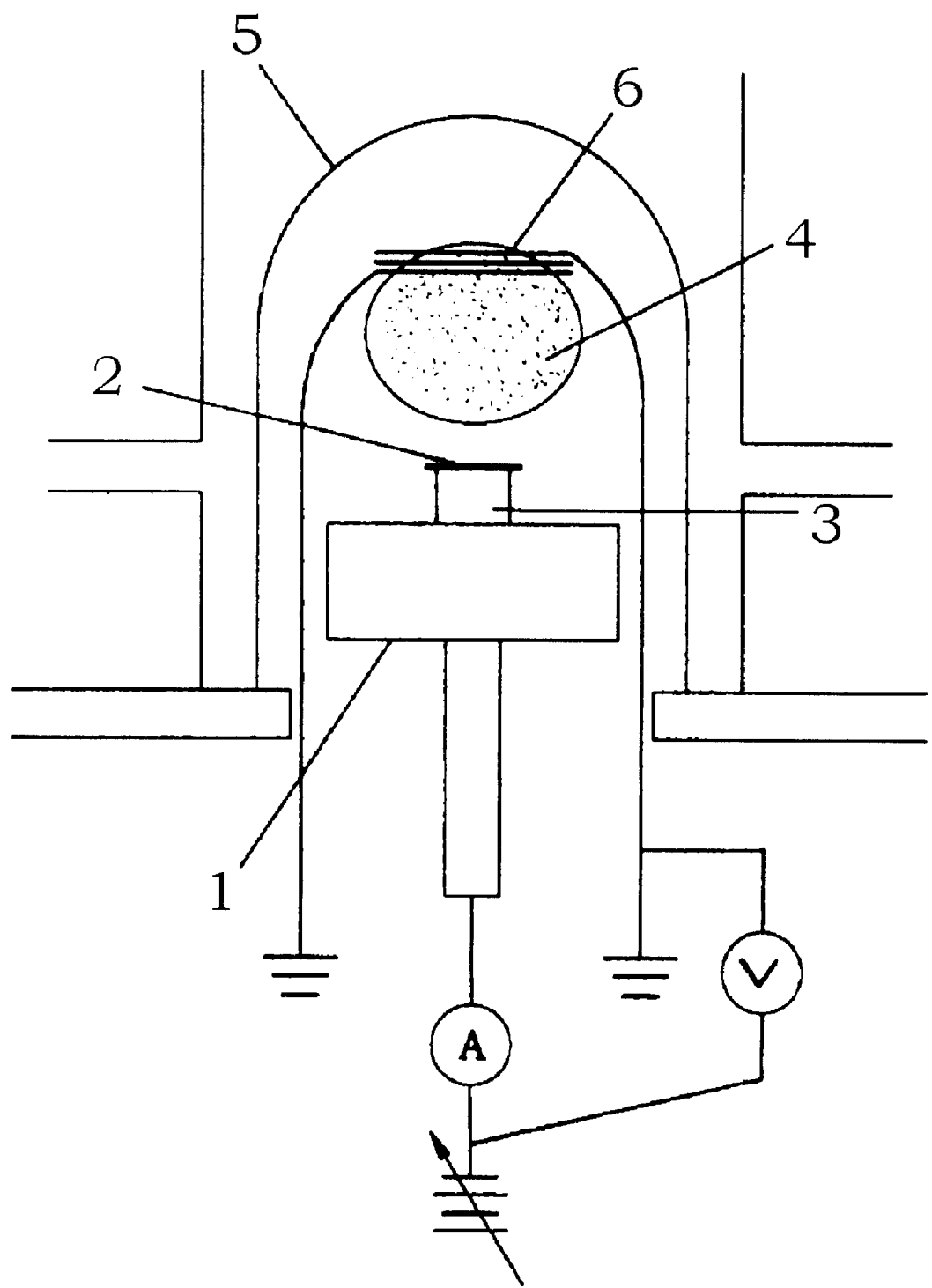
FIG. 1(a) is a schematic diagram showing a microwave plasma treatment device for plasma-treating a lithium transition metal oxide thin film according to the present invention.
Figure 1B:
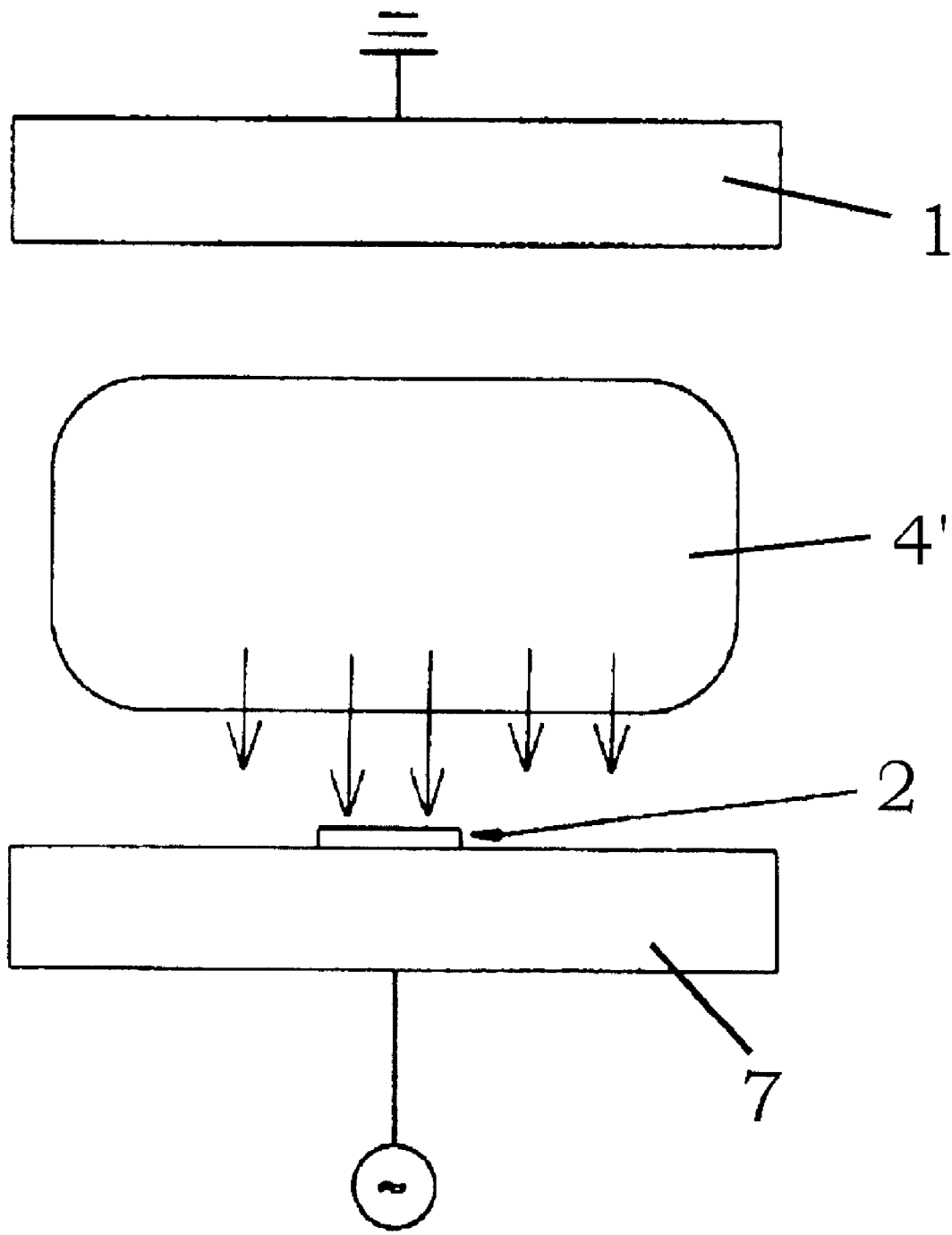
FIG. 1(b) is a schematic diagram showing a RF plasma treatment device for plasma-treating a lithium transition metal oxide thin film according to the present invention.

FIGS. 1(a) and 1(b) illustrate devices for plasma-treating a lithium transition metal oxide thin film, respectively. FIG 1(a) is a schematic diagram of a microwave plasma treatment device using a microwave with a frequency of 2.45 GHz as a plasma-generating source. A specimen 2 on which a lithium transition metal (lithium-cobalt oxide: $LiCoO_2$) thin film has been vapor-deposited is placed onto a substrate holder while a graphite block 3 having a size similar to that of the specimen 2 being inserted between the holder 1 and the specimen 2.

Thereafter, oxygen plasma 4 in the form of a disk is created over the specimen 2 so as to be reacted with the specimen 2. Reference numeral "10" being not yet described designates an electrode. Since a nonconductor quartz dome 5 is used as a reaction tube, an electrode comprising a stainless tube of ⅛ inch in diameter and a kanthal wire of 1 mm in diameter wound around the stainless tube is installed in a coiled form within the reaction tube and then grounded.

FIG 1(b) is a schematic diagram of RF plasma treatment device using an RF wave with a frequency of 13.56 GHz as a plasma-generating source. A plasma 4' consisting of oxygen and argon is created between a substrate holder 1 and a target 7 to be reacted with a specimen 2 ($LiCoO_2$ thin film/substrate) on the target 7.

Figure 2:
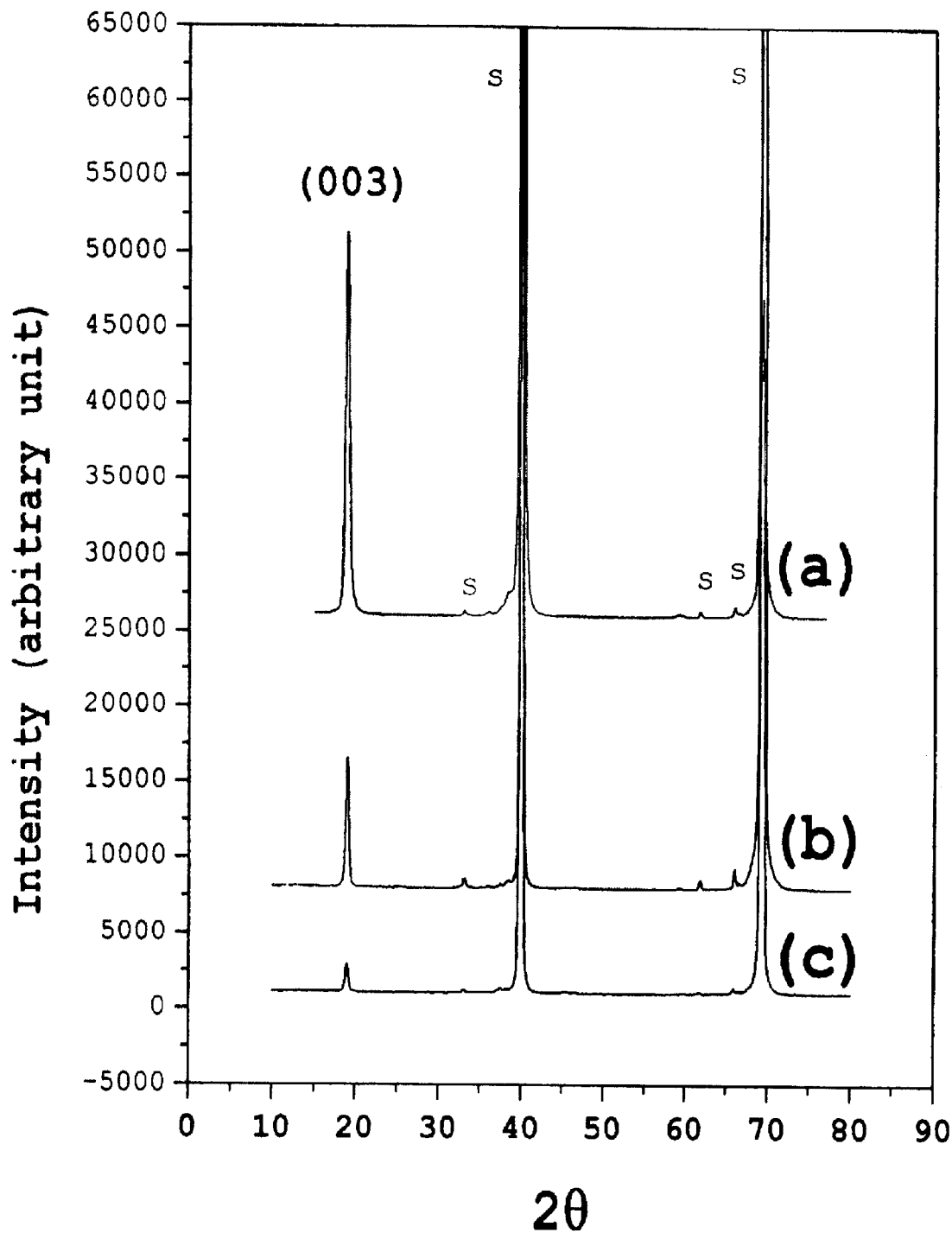
FIG. 2 is a graph representing a result of X-ray diffraction analysis of a lithium-cobalt oxide thin film treated by microwave plasma according to the present invention together with that of a lithium-cobalt oxide thin film treated thermally in the conventional generic furnace.

FIG. 2 shows a result of X-ray diffraction analysis of the lithium-cobalt oxide thin film treated by the microwave plasma together with that of a lithium-cobalt oxide thin film treated thermally in the conventional generic furnace. In FIG. 2, graph (a) represents a case of reacting the plasma with the thin film at a temperature of 391° C. and power of 500 W for 5 minutes, and graph (b) represents a case of treating the thin film thermally at a temperature of 800° C. for 2 hours in the generic furnace. In comparison of graph (a) with graph (b), it is seen that intensity of peak (003) of the case according to the present invention is significantly increased over that of the conventional case.

According to a research by R. Koksbang et al., Solid State Ionics, 84, 1996, p. 1, it is considered that this peak (003) is a measure of the degree of crystalline of the lithium transition metal oxide thin film, and the higher intensity of the peak is and the narrower a width of the peak is, that is, the sharper the peak is, the more a structure of the thin film is favorable for charging/discharging lithium ions electrochemically. In the microwave plasma treatment, the plasma induced by such a high frequency of 2.45 GHz contains ions and radicals with high energy, these ions and radicals collide against the thin film, and energy is transmitted to the thin film because the plasma itself radiates energy. Also, the ions and radicals with high energy produced within the plasma fill in cavities of the oxygen or react with inner cobalt atoms. In conclusion, increase of inner bonding due to the microwave plasma will have an effect on enhancement of the degree of crystalline, which effect is also achieved by other plasma than the microwave plasma, such as, RF plasma.

Further, a crystallization process requiring a temperature of 800° C. and a treatment time of 2 hours in the conventional generic-furnace-thermal treatment is shortened to a temperature of 391° C. and a treatment time of 5 minutes by the microwave plasma treatment according to the present invention. Although the temperature becomes lower and the treatment time becomes shorter, the effect on the enhancement of the degree of crystalline is much greater than that by the conventional furnace-thermal treatment.

For the sake of comparison, FIG. 2 also exhibits graph (c) representing a result of X-ray diffraction analysis of a vapor-deposited thin film without any thermal treatment. The intensity of the peak (003) is very slight in the graph (c), which means that the degree of crystalline is very low. Peak "s" is an X-ray peak indicating the substrate.

Figure 3:
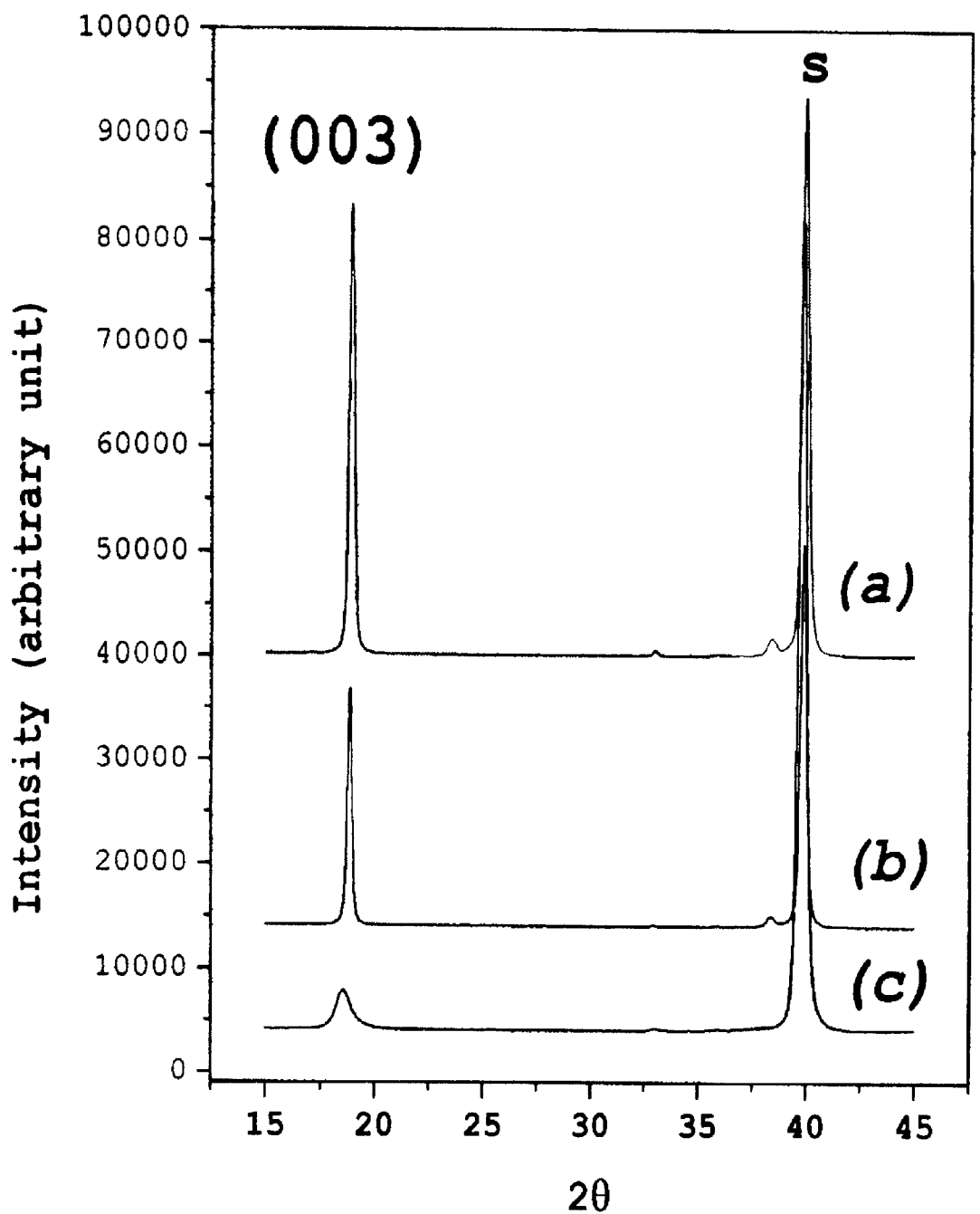
FIG. 3 is a graph representing results of X-ray diffraction analysis of a lithium-cobalt oxide thin film treated by an RF plasma in accordance with a different treatment time.

FIG. 3 shows results of X-ray diffraction analysis of a lithium-cobalt oxide thin film treated by the RF plasma in accordance with a different treatment time. The RF power used in this case is as low as 20 W in order to enable the plasma to be induced, but to prevent sputtering of the thin film material. As the treatment time is lengthening to 5 minutes (graph (b)) and 15 minutes (graph (a)), the intensity of the peak (003) grows higher and higher compared with that of the vapor-deposited thin film without any thermal treatment (graph (c)).

That is, the longer the plasma treatment time is, the higher the degree of crystalline is. The effect on the enhancement of the degree of crystalline by the RF plasma treatment is far more efficient than that by the conventional generic-furnace thermal treatment in terms of the process temperature and the process time.

Figure 4A:
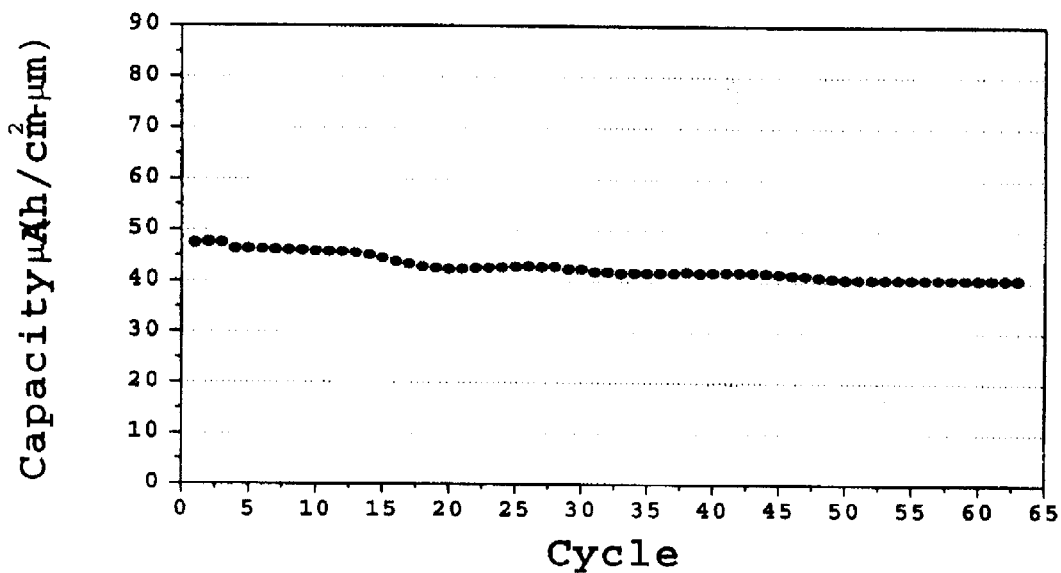
FIGS. 4(a) and 4(b) are graphs representing changes in discharge capacity of the lithium-cobalt oxide thin films treated by the plasma according to the present invention and the conventional generic furnace-thermal treatment, respectively.
Figure 4B:
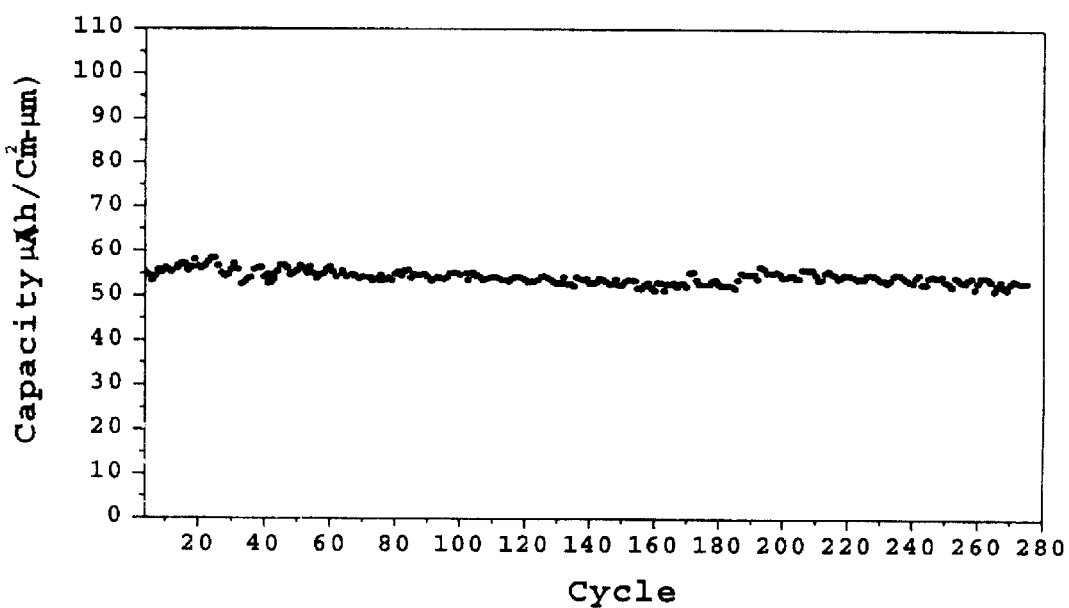

FIGS. 4(a) and 4(b) show changes in discharge capacity of the lithium-cobalt oxide thin films measured at a current density of 20 $\mu A/cm^2$ and a voltage of 4.3 to 3.0 V as a function of a discharge cycle.

FIG. 4(a) represents a case of treating the thin film thermally at a temperature of 800° C. for 2 hours in the generic furnace to enhance the degree of crystalline. As seen from this graph of FIG. 4(a), the discharge capacity is 49 $\mu A/cm^2$ at a first cycle and this initial discharge capacity is reduced by 8.3% after 64 cycles. On the contrary, FIG. 4(a) represents a case of treating thin film for 15 minutes by the RF plasma to enhance the degree of crystalline, which indicates that the initial discharge capacity is increased to 65 $\mu A/cm^2$ and at the same time the discharge capacity is 64 $\mu A/cm^2$ as ever after 280 cycles, that is to say, the thin film treated by the RF plasma exhibits excellent electrochemical characteristics without reduction in the discharge capacity.

According to the present invention, a trouble in requiring a high temperature of 750° C. or more and a process time between several hours and several tens of hours for the conventional crystallization process of the lithium transition metal oxide thin film is completely solved by the plasma treatment of the present invention using a low temperature of 400° C. or less and a treatment time within 20 minutes. In spite of the lower temperature and the shorter treatment time than in conventional furnace-thermal treatment, the effect on the enhancement of the degree of crystalline is far more effective, the discharge capacity and the stability of the electrode in accordance with the cycle can be improved, and surface flatness of the thin film may be also improved.

The microwave plasma and the RF plasma with a frequency of 2.45 GHz and 13.56 MHz, respectively are generally used in the existing semiconductor processes and both of them are effective in the enhancement of the degree of crystalline. Thus, the plasma treatment according to the present invention can solve the problem in impossibility to use the glass substrate, the plastic substrate or the metal substrate having a lower melting point, satisfy the required electrochemical characteristics, and contribute to the commercialization of the lithium thin film battery used as the driving or auxiliary power source of the existing semiconductor memory, the thin film-type gas sensor, the smart card and so forth.

While the present invention has been illustrated and described under considering preferred specific embodiments thereof, it will be easily understood by those skilled in the art that the present invention is not limited to the embodiments, and various changes and modifications may be made without departing from the true scope of the present invention.

What is claimed is:

1. A method for crystallizing a lithium transition metal oxide thin film, the method comprising the steps of:
    vapor-depositing a lithium transition metal oxide thin film as an electrode material on a substrate; and
    subsequently treating the lithium transition metal oxide thin film by a plasma for a time period less than or equal to 20 minutes, the plasma including a gas selected from the group consisting of oxygen, an inert gas, or a mixture thereof.

2. The method as recited in claim 1, wherein the plasma treatment is performed using microwave or radio frequency energy.

3. The method as recited in claim 1, wherein the lithium transition metal oxide thin film is composed of at least one oxide selected from the group consisting of $LiCoO_2$, $LiNiO_2$, $LiMn_2O_4$, $V_2O_2$, $V_6O_{13}$, $SnO_2$, oxides of $TiS_2$, oxides of LiAl, $LiGaO_2$, $LiTiO_2$, and $Li_3PO_4$.

4. A method as recited in claim 1, wherein the plasma gas is oxygen, inert gas or a mixture of oxygen and inert gas.

5. The method as recited in claim 1, wherein the inert gas is any one selected from the group consisting of argon, helium, neon, krypton and xenon.

6. The method as recited in claim 1, wherein the substrate is any one type of substrate selected from the group consisting of a silicon substrate, an alumina substrate, a glass substrate and an aluminum substrate.

7. The method as recited in claim 1, wherein the substrate is a $Pt/Ti/SiO_2/Si$ substrate in which a silicon substrate as a base is covered with silicon oxide ($SiO_2$), titanium (Ti) and platinum (Pt) in sequence.

* * * * *